United States Patent [19]

Krause

[11] 3,867,142

[45] Feb. 18, 1975

[54] PHOTOSENSITIVE MATERIALS FOR PRODUCING PRINTING PLATES

[75] Inventor: Willy Krause, Am Rottland, Germany

[73] Assignee: Krause Offset System KG, Bielefeld, Germany

[22] Filed: Apr. 16, 1973

[21] Appl. No.: 351,506

[52] U.S. Cl. ................ 96/35.1, 96/115, 204/159.14, 204/159.18, 204/159.21, 260/64

[51] Int. Cl. ................................................ G03c 5/08

[58] Field of Search ............. 96/35.1, 115 R, 115 P; 204/159.14, 159.18, 159.21; 260/64

[56] References Cited

UNITED STATES PATENTS

| | | | |
|---|---|---|---|
| 3,484,239 | 12/1969 | Steppan et al. | 96/35.1 |
| 3,497,354 | 2/1970 | Steppan et al. | 96/35.1 |
| 3,575,925 | 4/1971 | Skoultchi | 96/35.1 |
| 3,620,733 | 11/1971 | Steppan et al. | 96/35.1 |

*Primary Examiner*—Norman G. Torchin
*Assistant Examiner*—J. P. Brammer
*Attorney, Agent, or Firm*—Michael S. Striker

[57] ABSTRACT

A photosensitive coating composition that is suitable for use in the production of printing plates which consists essentially of a solution in an organic solvent of a polymer of an aldol-condensation product of terephthalaldehyde and diacetone alcohol having a molecular weight between 5000 and 15,000.

6 Claims, No Drawings

PHOTOSENSITIVE MATERIALS FOR PRODUCING PRINTING PLATES

BACKGROUND OF THE INVENTION

The present invention pertains to a photosensitive film-forming material for the production of printing plates.

In accordance with a preferred embodiment of the present invention, a film-forming material is fomred from terephthalaldehyde (1,4-benzenedicarbonal) and diacetone alcohol (4-hydroxy-4-methyl-2-pentanone). These two compounds react in the presence of an alkali in accordance with the following general aldol-condensation reaction:

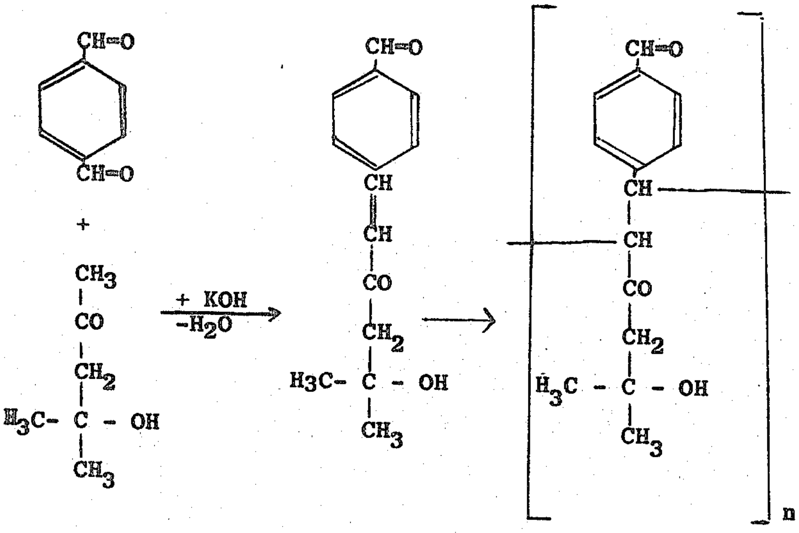

to form resins having molecular weights between 5000 and 500,000 dependent upon the degree to which the condensation is conducted, namely polymers in which *n* in the foregoing formula is between 21 and 63. The polymeric copying materials that are produced from such polymers which have molecular weight between 5000 and 15,000 have proved to be especially sensitive to light.

On exposure of the thus-produced film materials to light, higher polymeric molecules having two and three times the molecular weight of the original polymer are formed. Such molecules are substantially insoluble in the usual solvents, so that the exposed portion of the film becomes resistant to the action of solvents. The unexposed portion of the film, however, is readily soluble in N,N-dimethylformamide and other solvents such as are referred to hereinafter, so that a self-supporting film having considerable advantage over known films for use in photomechanical reproduction processes can be produced.

Printing plates have been prepared heretofore from photosensitive prepolymers that were capable of undergoing a further polymerization to form polymers having higher molecular weights. However, it was not possible to prepare from such prior known photosensitive prepolymer, self-supporting films that possessed sufficient strength for use in printing. Attempts have accordingly been made to produce photosensitive film-forming materials that possessed greater strength and did not have the disadvantage that the known prepolymers had. Subsequently, it was proved that the prior photosensitive prepolymers were susceptible to crystallization, as a result of which it was not possible to obtain a compact or coherent film that at the same time accurately reproduced the gradations of tone of the original copy.

SUMMARY OF THE INVENTION

The object of the present invention is to provide a photosensitive film-forming material that is suitable for the production of printing plates, which, upon polymerization, forms self-supporting films and thereby also assures the production of copies accurately reproducing the tonal values of the original.

The photosensitive film-forming polymer of the present invention consists essentially of a polymer of an aldol-condensation product of an aromatic aldehyde having at least two carbonyl radicals and an aliphatic or aromatic ketone having an active methyl or methylene radical in an alkaline medium. The thus-obtained material, is contradistinction to the heretofore used prepolymers, is adapted fto produce a self-sustaining film having the requisite strength. Furthermore, the polymers thus produced are still adequately photosensitive and are capable of producing copies that accurately reproduce the tonal gradations of the original.

These polymers have also proved to be suitable sensitizers for low-molecular-weight nitrocellulose and polyvinylbutyral resins.

EXAMPLES

The following is an example of a preferred photosensitive unsaturated polymeric film-forming material of the present invention and a preferred method of making the same.

1500 milliliters of ethanol, 139 grams (1.20 mol) of diacetone alcohol, 134 grams (1 mol) of terephthalaldehyde, and 100 milliliters of a 0.5-normal solution of potassium hydroxide in methanol are mixed and are thereafter stirred together at room temperature for a period between 30 and 40 minutes. The stirred mixture is then acidified by the addition of 20 milliliters of glacial acetic acid and the stirring is continued for an additional 20 minutes.

At the end of this period, the stirring is discontinued and the resin thus formed is separated by suction filtration, washed with 500 milliliters of ethanol and dried in a vacuum-drying oven. Only by observing the specified temperature and stirring schedule can a macromolecular structure be obtained that provides a film which is self-sustaining yet is not so highly polymerized as to have lost its inherent photosensitivity. In this manner, approximately 90% of the theoretical yield of the resin is obtained in the form of coarse granules having a deep yellow color and a molecular weight between 5000 and 15,000.

Dyes or pigments may also be added to this resin if desired.

From the resin thus produced, a photosensitive solution can be prepared as follows:

Fifty grams of the resin and 5 grams of $\alpha,\alpha'$,azobis-(isobutyronitrile) as sensitizer are dispersed in 50 milliliters of N,N-dimethylformamide and heated to boiling, after which 500 milliliter of cyclohexanone are added thereto and the solution is allowed to cool gradually.

After cooling and filtering, the solution is ready for use in making films. For this purpose an aluminum plate which has been anodically oxidized or otherwise preliminarily subjected to mechanical, hydromechanical, aero-mechanical, or chemical treatments, or any combination thereof, is coated with the solution. The coating can be applied either by spinning, spraying, or by electrostatic means, as well as by simple immersion of the aluminum plate in the solution or by pouring the solution onto the surface of the plate.

The thus-coated plate can be exposed under a negative and be subsequently developed with a suitable developer either manually or automatically. The non-printing spots on the plate are then made hydrophilic by application of gum arabic and phosphoric acid and or in other conventional manners and the printing element is colored with an oily carbon black printing ink or other printing medium and coated with a protective gum.

A composition consisting of 750 milliliters of N,N-dimethylformamide, in which the resin is soluble, 100 milliliters of a 10% aqueous gum arabic solution, 100 milliliters of turpentine and 50 milliliters of ethylene glycol monoethyl ether (2-ethoxyethanol) proved to be an especially suitable developer for producing printing plates from the photosensitive film-forming material of the present invention.

A composition which is also a suitable developer for the film for making material of the present invention consists of 800 milliliters of N,N-dimethylformamide, 50 milliliters of a 10% aqueous solution of polyacrylic acid, 10 grams of abietic acid and 140 milliliters of 2-ethoxyethanol. The abietic acid is particularly useful for increasing the absorbability of dyestuffs in the film.

Inasmuch as the foregoing description comprises preferred embodiments of the invention which were selected solely for purposes of illustration, it is to be understood that the invention is not limited thereto and that modifications and alternations may be made in accordance with the foregoing teachings without departing from the invention, whose scope is limited only by the appended claims.

I claim:

1. A supported photosensitive film which consists essentially of a polymer of an aldol-condensation product of terephthalaldehyde and diacetone alcohol having a molecular weight between 5000 and 15,000 and a sensitizer therefor.

2. A coating composition for the production of a supported photosensitive film as defined in claim 1 which consists essentially of a solution in an organic solvent of a polymer of an aldol-condensation product of terephthalaldehyde and diacetone alcohol having a molecular weight between 5000 and 15,000 together with a sensitizer therefor.

3. A coating composition as defined in claim 2 in which the sensitizer is $\alpha,\alpha'$-azobis(isobutyronitrile).

4. A coating composition as defined in claim 2 in which the organic solvent is a mixture of cyclohexanone and N,N-dimethylformamide.

5. A coating composition as defined in claim 2 which also includes a dyestuff or pigment or both.

6. A process for the production of a printable image on a printing plate coated with a film of the photosensitive film-forming substance defined in claim 2, which comprises exposing to light the film on the plate to produce a latent image therein, and thereafter developing the exposed film by treating it with a liquid containing N,N-dimethylformamide or other dialkyl-substituted acid amide or a low-molecular-weight aliphatic acid and subsequently treating the film with a natural or synthetic colloid, or phosphoric acid or a phosphate, or both, to increase its water-absorbability.

* * * * *